(12) United States Patent
Lin et al.

(10) Patent No.: US 12,165,868 B2
(45) Date of Patent: Dec. 10, 2024

(54) SEMICONDUCTOR DEVICE IN A CONTAINMENT STRUCTURE INCLUDING A BURIED LAYER

(71) Applicant: Taiwan Semiconductor Manufacturing Company, Ltd., Hsinchu (TW)

(72) Inventors: Hung-Te Lin, Hsinchu (TW); Chia-Wei Liu, Zhubei (TW); Hung-Chih Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/203,849

(22) Filed: May 31, 2023

(65) Prior Publication Data

US 2023/0326749 A1    Oct. 12, 2023

Related U.S. Application Data

(62) Division of application No. 17/372,930, filed on Jul. 12, 2021, now Pat. No. 11,710,632.

(60) Provisional application No. 63/166,498, filed on Mar. 26, 2021.

(51) Int. Cl.
| | | |
|---|---|---|
| H01L 21/02 | (2006.01) | |
| H01L 21/266 | (2006.01) | |
| H01L 21/308 | (2006.01) | |
| H01L 21/761 | (2006.01) | |
| H01L 29/66 | (2006.01) | |

(52) U.S. Cl.
CPC .. *H01L 21/02496* (2013.01); *H01L 21/02529* (2013.01); *H01L 21/02532* (2013.01); *H01L 21/266* (2013.01); *H01L 21/308* (2013.01); *H01L 21/761* (2013.01); *H01L 29/66666* (2013.01)

(58) Field of Classification Search
CPC ......... H01L 21/02529; H01L 21/02532; H01L 21/266; H01L 21/308; H01L 21/761
USPC ....................................................... 257/618
See application file for complete search history.

(56) References Cited

U.S. PATENT DOCUMENTS

| | | | |
|---|---|---|---|
| 2009/0283827 A1* | 11/2009 | Pendharkar | H01L 29/1095 |
| | | | 257/E29.256 |
| 2017/0092761 A1* | 3/2017 | Habenicht | H01L 29/0882 |

* cited by examiner

*Primary Examiner* — Quoc D Hoang
(74) *Attorney, Agent, or Firm* — Lippes Mathias LLP (57) ABSTRACT

In a semiconductor manufacturing method, a mask is disposed on a semiconductor layer or semiconductor substrate. The semiconductor layer or semiconductor substrate is etched in an area delineated by the mask to form a cavity. With the mask disposed on the semiconductor layer or semiconductor substrate, the cavity is lined to form a containment structure. With the mask disposed on the semiconductor layer or semiconductor substrate, the containment structure is filled with a base semiconductor material. After filling the containment structure with the base semiconductor material, the mask is removed. At least one semiconductor device is fabricated in and/or on the base semiconductor material deposited in the containment structure.

20 Claims, 12 Drawing Sheets

SEMICONDUCTOR DEVICE IN A CONTAINMENT STRUCTURE INCLUDING A BURIED LAYER

This application is a divisional of U.S. application Ser. No. 17/372,930 filed Jul. 12, 2021 and issued as U.S. Pat. No. 11,710,632, which claims the benefit of U.S. provisional application Ser. No. 63/166,498 filed Mar. 26, 2021 and titled "SEMICONDUCTOR DEEP BURIED LAYER". U.S. application Ser. No. 17/372,930 filed Jul. 12, 2021 and U.S. provisional application Ser. No. 63/166,498 filed Mar. 26, 2021 are each incorporated herein by reference in its entirety.

BACKGROUND

The following relates to semiconductor devices that include a buried layer, to semiconductor devices with a buried carrier injection layer, to semiconductor devices with an isolation layer, to methods of manufacturing such semiconductor devices, to integrated circuits (ICs) including such semiconductor devices, and so forth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
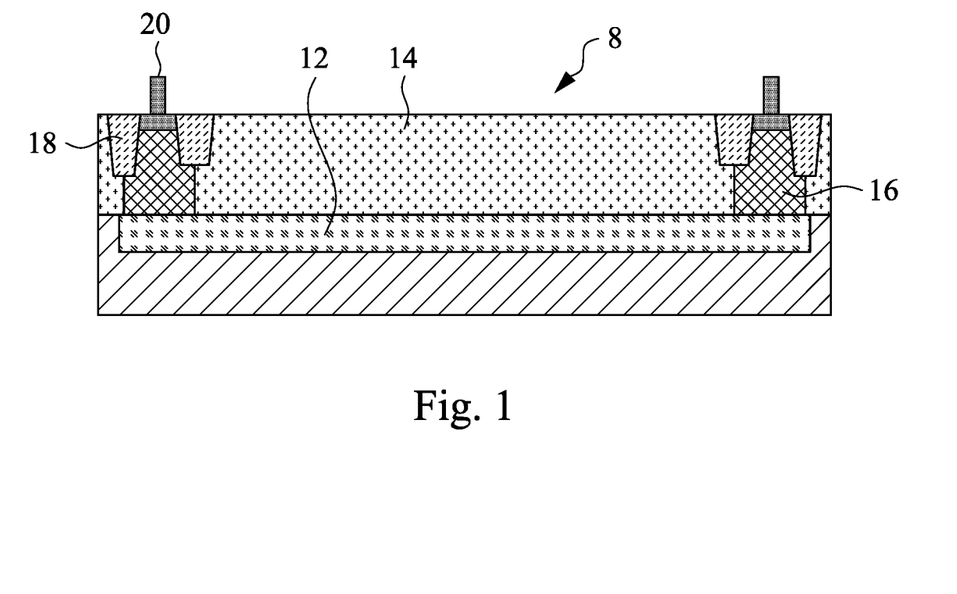
FIGS. 1 and 2 diagrammatically illustrate side-sectional and top views, respectively, of a device with a buried layer according to a first device embodiment.
Figure 2:
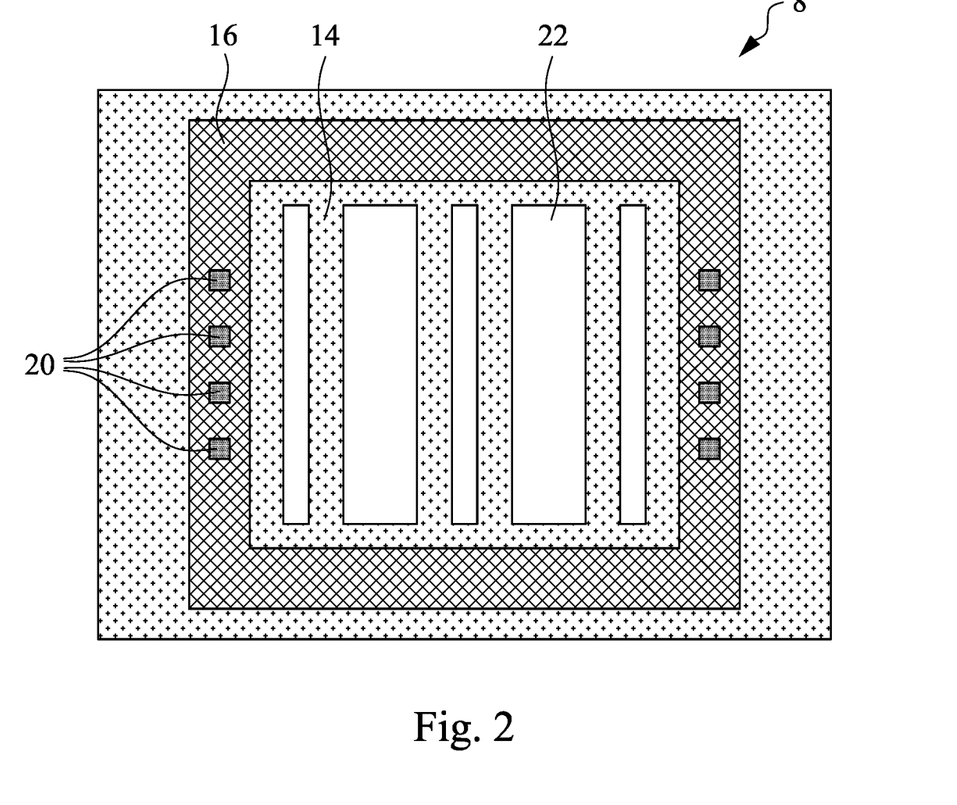
Figure 3:
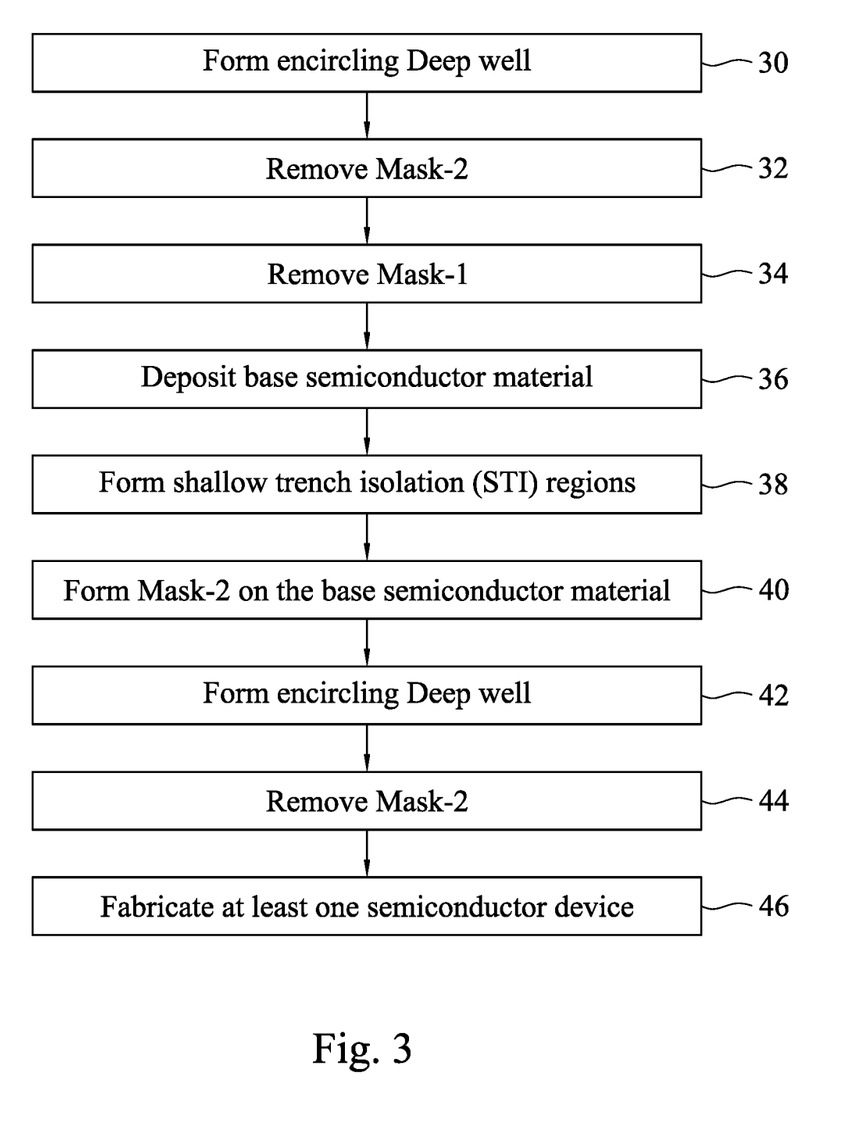
FIGS. 3-7 diagrammatically illustrate a fabrication process for fabricating a device with a buried layer according to a first process embodiment.

With reference to FIGS. 1 and 2, a device is shown in side-sectional view (FIG. 1) and top view (FIG. 2). The device 8 includes a semiconductor layer or semiconductor substrate 10 on which is disposed a buried n-type or p-type layer 12 that is doped highly n-type (that is, $n^+$ doped) or highly p-type (that is, p+ doped) and a base semiconductor material 14 in that order. A containment structure for containing the base semiconductor material 14 is formed by the buried layer 12 and an encircling deep well 16 which is also $n^+$ doped or p+ doped (same type as buried layer 12) and is formed by ion implantation into an encircling periphery of the base semiconductor material 14. Shallow trench isolation (STI) regions 18 may be formed adjacent the deep well 16 to provide electrical isolation for electrodes 20 formed on the deep well 16 where it penetrates the surface of the device 8, as shown in FIG. 1. At least one semiconductor device 22 is fabricated in and/or on the base semiconductor material 14 in the region encircled by the deep well 16. Note, the at least one semiconductor device 22 is diagrammatically indicated in FIG. 2 by STI regions of the at least one semiconductor device 22; however, more generally the at least one semiconductor device 22 may include a transistor, photodetector, metal oxide semiconductor (MOS) device, a field effect transistor (FET) such as a MOS-FET, a capacitance device, various combinations thereof, and/or so forth as further non-limiting examples. In some embodiments, the at least one semiconductor device may not include any STI regions.

The containment structure formed by the deep buried layer 12 and deep well 16 is useful for a wide range of semiconductor devices. For example, in a laterally-diffused metal-oxide semiconductor (LDMOS) device, the base semiconductor material 14 is doped with n-type or p-type which depends on the structure. The deep buried layer 12 and deep well 16 are opposite doping type compared with the semiconductor substrate 10. If the semiconductor substrate 10 is doped p-type, then the buried layer 12 and deep well 16 are both doped $n^+$-type. Conversely, if the semiconductor substrate 10 is doped n-type, then the buried layer 12 and deep well 16 are both doped $p^+$-type. Another type of device that can benefit from a containment structure is a thin-film transistor liquid crystal display (TFT-LCD) driver integrated circuit (IC), in which the TFT-LCD may be designed to operate at lower voltages and be contained by a containment structure doped at a higher level. These are merely nonlimiting illustrative examples, and more generally various types of semiconductor devices may be fabricated with an n$^+$-type or p$^+$-type doped containment structure depending on the semiconductor device type and the doping characteristics of the substrate. Furthermore, some devices may be beneficially fabricated with a semi-insulating containment structure.

Figure 4:
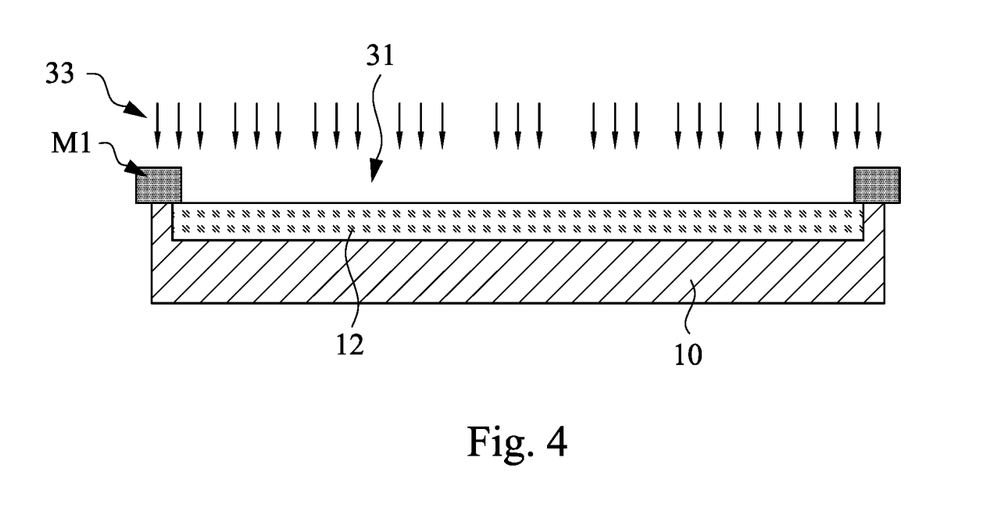
Figure 6:
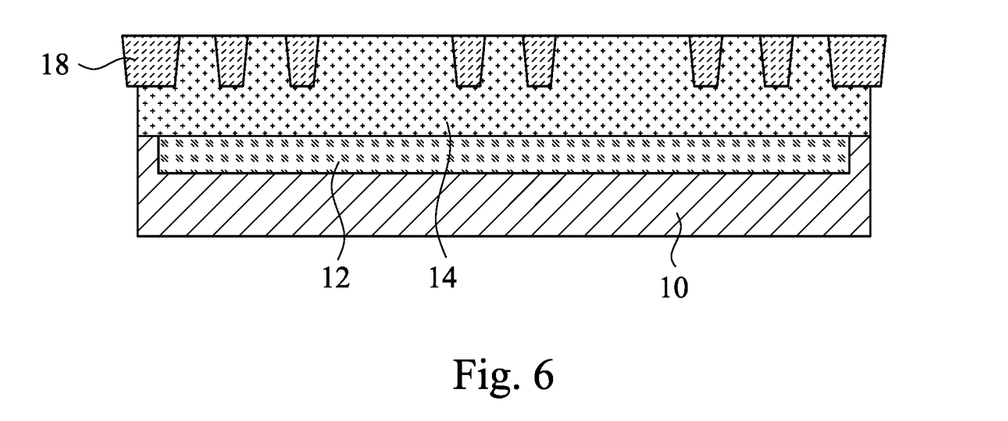
Figure 7:
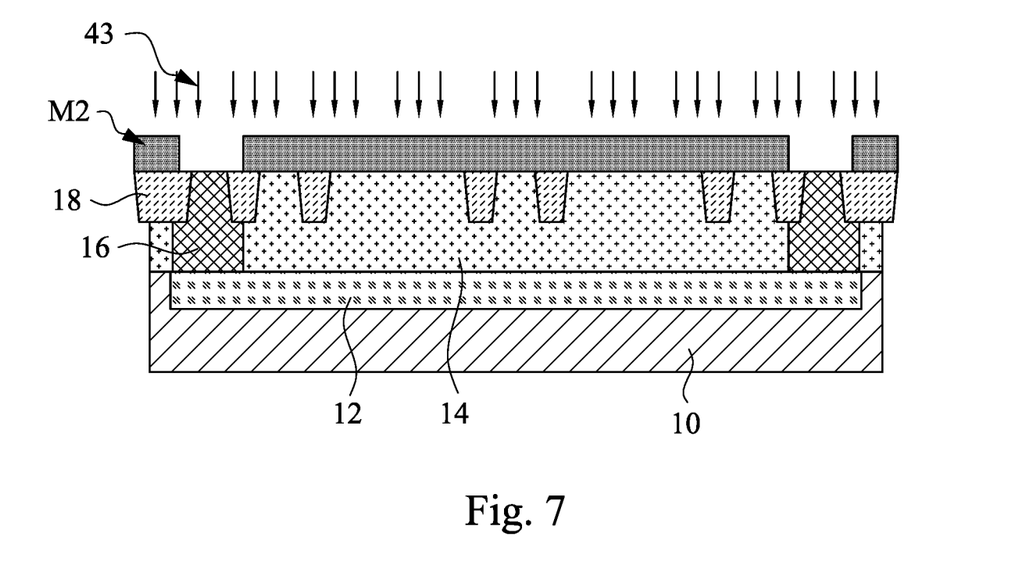
Figure 8:
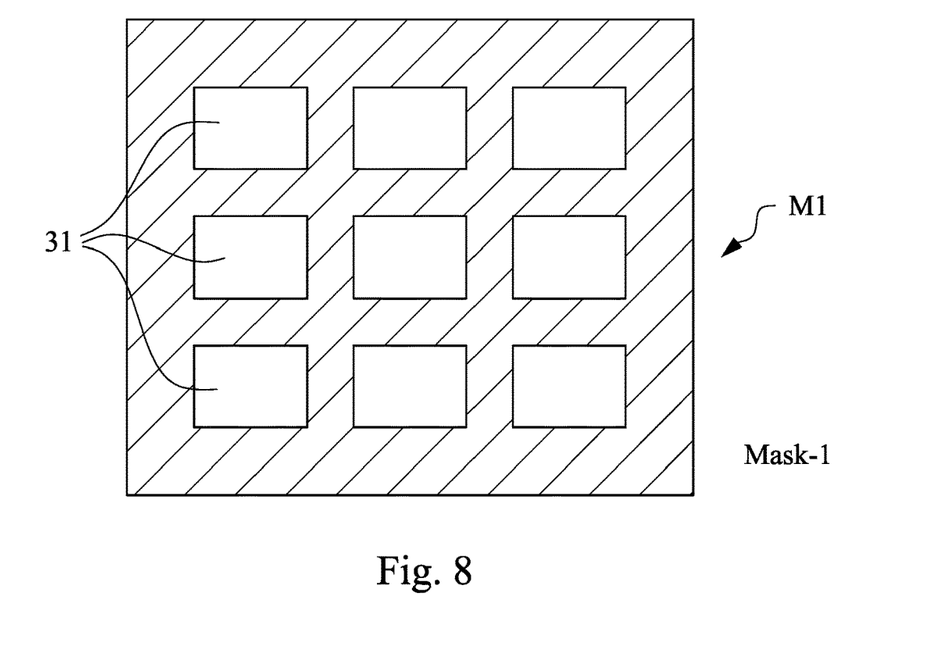
FIGS. 8 and 9 diagrammatically illustrate top views of Mask-1 and Mask-2 suitable for use in fabrication processes such as those described herein.
Figure 9:
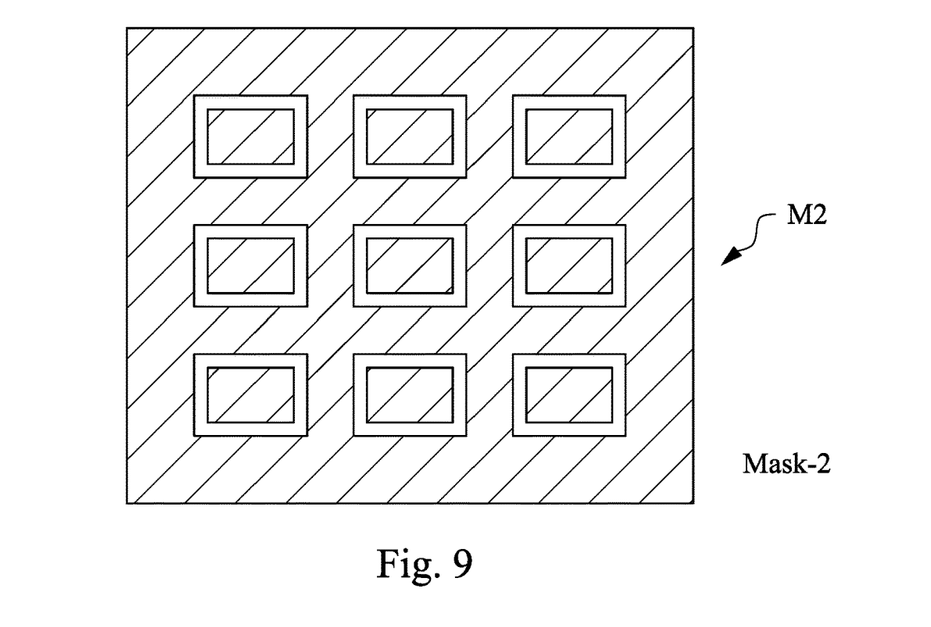

With reference to FIGS. 3-9, a suitable process for fabricating the device 8 is described. In an operation 30, a first mask (hereinafter "Mask-1" or "mask M1") is fabricated on the semiconductor layer or semiconductor substrate 10. FIG. 4 illustrates mask M1 on the semiconductor layer or semiconductor substrate 10. FIG. 8 shows a top view of an illustrative embodiment of Mask-1. The illustrative Mask-1 provides for fabricating a 3×3 array of devices 8, while FIGS. 4-7 illustrate side sectional views of fabrication steps showing fabrication of one of those devices 8. As seen in FIG. 8, for each device the Mask M1 has openings 31, with one such opening 31 corresponding to each device (see FIG. 4). It will be appreciated that the depiction in FIG. 8 of Mask-1 for a 3×3 array of devices 8 can be generalized to a mask for generating an N×M array of devices 8, and that the illustrative 3×3 array is merely an example. By way of one nonlimiting illustrative example, Mask M1 may be formed on the surface of the semiconductor layer or semiconductor substrate 10 by deposition and lithographic patterning of a resist material followed by deposition of the mask material by vacuum deposition, sputtering, or another deposition technique in accordance with the lithographic pattern, and subsequent removal of the resist.

In an operation 32, the buried layer 12 is formed by ion implantation (diagrammatically indicated by arrows 33 in FIG. 4). The mask M1 is resistant to the ion implantation, so that the ion implantation is limited by mask M1 to the area of the opening 31, to form the buried layer 12 only in the defined area. (As a note, for convenience the layer 12 is referred to as a "buried" layer throughout, even though at the fabrication stage of operation 32 the layer 12 is not yet "buried".) By way of nonlimiting illustrative example, the mask M1 may comprise silicon nitride, silicon oxide, or another material of sufficient thickness and resistance to the ion implantation. For formation of the buried layer 12 as an n$^+$ doped layer, the ion implantation suitably implants substitutional or interstitial donor atoms into the semiconductor layer or semiconductor substrate 10. Conversely, for formation of the buried layer 12 as an p$^+$ doped layer, the ion implantation suitably implants substitutional or interstitial acceptor atoms into the semiconductor layer or semiconductor substrate 10. In an operation 34, the mask M1 is removed, leaving the buried layer 12 (albeit not yet buried).

Figure 5:
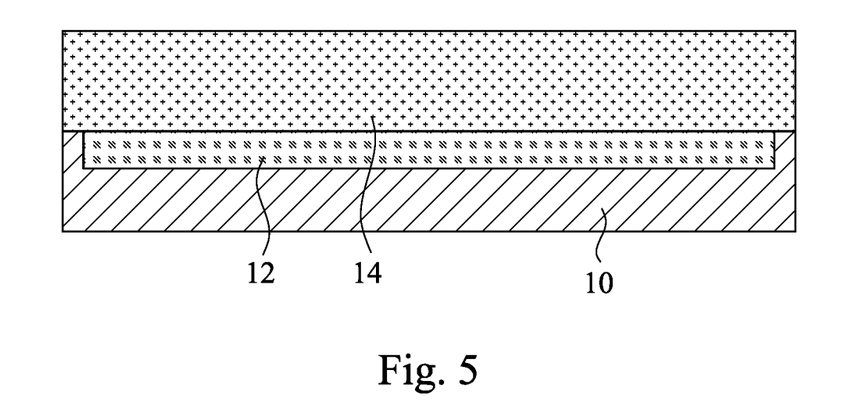

In an operation 36 and with reference to FIG. 5, the base semiconductor material 14 is deposited, thus burying the buried layer 12 underneath the base semiconductor material 14. The deposition operation 36 is, in some nonlimiting embodiments, an epitaxial deposition. For example, if the semiconductor layer or semiconductor substrate 10 is a silicon layer or substrate, then the deposition operation 36 may comprise homoepitaxial deposition of silicon as the base semiconductor material, or may comprise heteroepitaxial deposition of a silicon alloy such as silicon germanium (SiGe) or silicon carbide (SiC), or heteroepitaxial deposition of another semiconductor material reasonably closely lattice-matched and chemically compatible with silicon.

In an optional operation 38 and with reference to FIG. 6, shallow trench isolation (STI) regions 18 may be formed in the base semiconductor material. For example, the STI regions 18 may be formed by lithographic patterning, trench etching, and trench filling with an oxide or other electrical insulator or the like. Additionally or alternatively, other types of device processing may be performed at this stage to fabricate portions or components of the at least one semiconductor device 22.

In an operation 40 and with reference to FIG. 7, a second mask (hereinafter "Mask-2" or "mask M2") is fabricated on the base semiconductor material 14. FIG. 7 illustrates mask M2 on the base semiconductor material 14. FIG. 8 shows a top view of an illustrative embodiment of Mask-2 formed on the base semiconductor material 14. The illustrative Mask-2 provides an opening corresponding to the encircling deep well 16 of each device 8 of the 3×3 array of devices 8. By way of one nonlimiting illustrative example, Mask M2 may be formed on the base semiconductor material 14 by deposition and lithographic patterning of a resist material followed by deposition of the mask material by vacuum deposition, sputtering, or another deposition technique in accordance with the lithographic pattern, and subsequent removal of the resist.

In an operation 42 continuing to correspond to FIG. 7, the encircling deep well 16 is formed. In illustrative FIG. 7 the deep well 16 is formed by ion implantation (diagrammatically indicated by arrows 43 in FIG. 7). The mask M2 is resistant to the ion implantation, so that the ion implantation is limited by mask M2 to the area of the encircling deep well 16, to form the encircling deep well 16 only in the defined area. By way of nonlimiting illustrative example, the mask M2 may comprise silicon nitride, silicon oxide, or another material of sufficient thickness and resistance to the ion implantation. For formation of the encircling deep well 16 as an n-type doped material, the ion implantation suitably implants substitutional or interstitial donor atoms into the semiconductor layer or semiconductor substrate 10. Conversely, in embodiments in which the buried layer 12 is a p" doped layer, the deep well 16 is suitably replaced by a p-type doped layer formed by ion implantation that implants substitutional or interstitial acceptor atoms into the semiconductor layer or semiconductor substrate 10.

In an operation 44, the mask M2 is removed. In an operation 46 the at least one semiconductor device 22 is fabricated (or, if portions of the at least one semiconductor device 22 were formed along with or in place of the STI regions formation 38, then the operation 44 completes the fabrication of the at least one semiconductor device 22. As previously noted, the at least one semiconductor device 22 may, by way of nonlimiting illustrative example, include one or more transistors, one or more photodetectors, one or more MOS devices, one or more FETs (e.g., one or more MOSFETs), one or more capacitance devices, various combinations thereof, and/or so forth. The device fabrication operation 46 may optionally include formation of the electrodes 20 formed on the deep well 16, as shown in FIG. 1.

The disclosed device 8 is especially effective for fabricating devices that are designed to incorporate a buried highly doped (e.g. n"-doped or p"-doped) layer as part of the device in which the buried doped layer is electrically accessible at the surface via the electrodes 20, and/or for fabricating devices that benefit from electrical isolation provided by the combination of the buried layer 12 and encircling deep well 16. Such devices include, by way of nonlimiting illustrative example, vertical metal oxide semiconductor (VMOS) devices (sometimes referred to as V-groove MOS devices), or vertical double diffused MOS (or vertical DMOS) devices (sometimes referred to as VDMOS devices), HVMOS, FIN-FET, memory, IGBT, RF devices, or so forth.

However, it is recognized herein that the device 8 of FIGS. 1 and 2, and the corresponding fabrication method described with reference to FIGS. 3-9, has certain limitations. One limitation is that it is difficult to the fabricate the device 8 with the base semiconductor material 14 being very thick. This is because the formation of the deep well 16 entails performing the ion implantation of operation 42 (see also FIG. 7) to a depth corresponding to the thickness of the base semiconductor material 14. If this thickness is too large then it may be difficult to perform the ion implantation to sufficient depth. Additionally, the ion implantation steps of the operations 32 and 42 have limited precision. For example, the buried layer 12 has a minimum achievable thickness that can be achieved by the ion implantation of operation 32; and similarly increased thickness of the base semiconductor material 14 leads to increase in the lateral width of the deep well 16 increases due to lateral dispersion of the ion implanted donor (or acceptor) atoms. To achieve a deeper ion implantation in the operation 42 may entail a tradeoff of reduced doping concentration in the deep well.

The fabrication process of device 8 of FIGS. 1 and 2 described with reference to FIGS. 4-8 also uses two masks M1 and M2 (i.e. Mask-1 and Mask-2). The second Mask-2 adds mask formation operation 40 and mask removal operation 44 to the process, increasing fabrication time and complexity. The formation of Mask-2 on the base semiconductor material 14, and its subsequent removal from the base semiconductor material 14, also introduces additional processing that can lead to (initial or additional) defect formation on or in the base semiconductor material 14. As the at least one semiconductor device 22 is fabricated on or in the base semiconductor material 14, this can be particularly detrimental to device yield.

Figure 10:
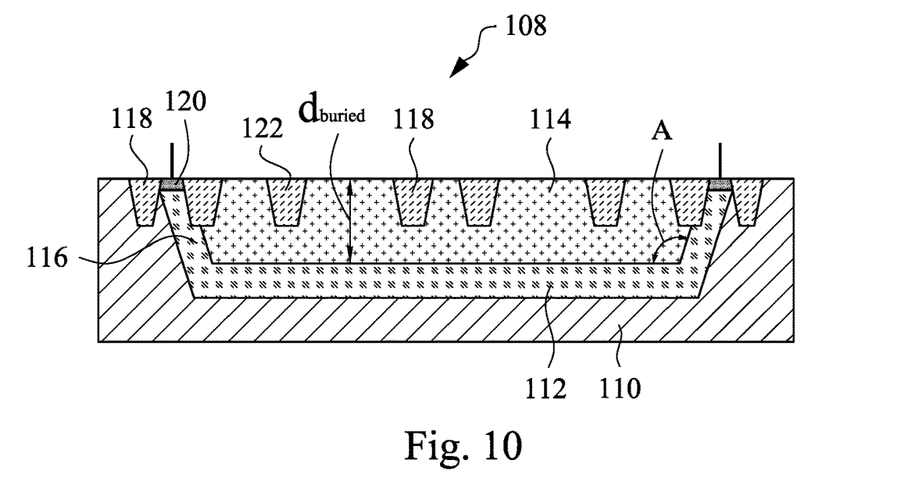
FIGS. 10 and 11 diagrammatically illustrate side-sectional and top views, respectively, of a device with a buried layer according to a second device embodiment.
Figure 11:
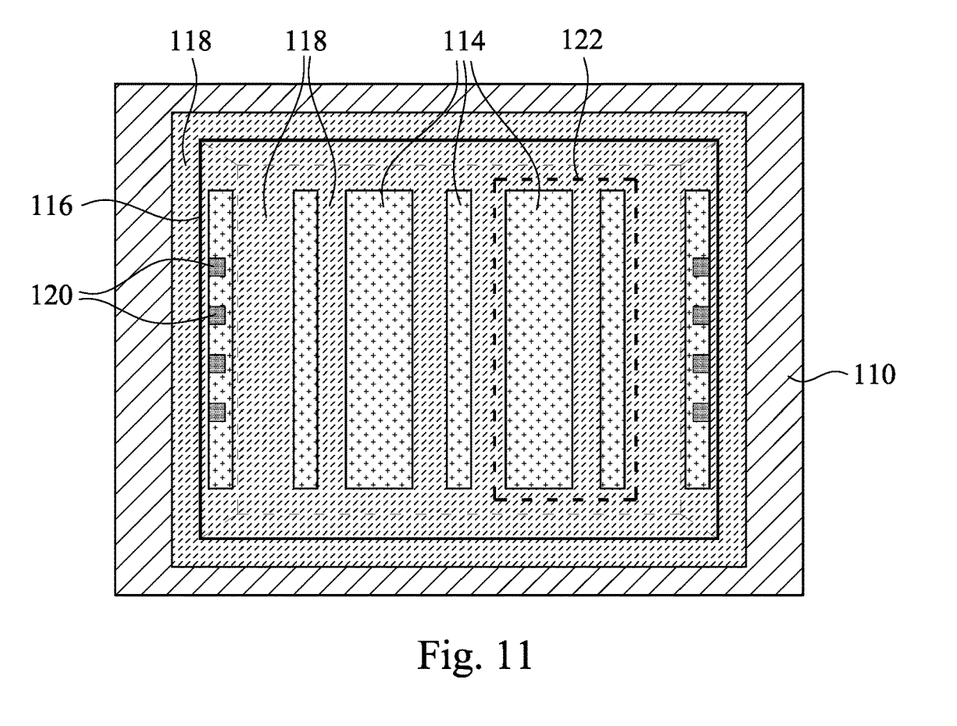

With reference to FIGS. 10 and 11, a device is shown in side-sectional view (FIG. 10) and top view (FIG. 11). The device 108 includes a semiconductor layer or semiconductor substrate 110 on which is disposed a buried n-type layer 112 that is doped highly n-type (that is, $n^+$ doped) and a base semiconductor material 114 in that order. A containment structure for containing the base semiconductor material 114 is formed by the buried layer 112 and an encircling sidewall 116 which as will be described is formed together with (and therefore typically comprises the same material as) the buried layer 112. While the illustrative containment structure is rectangular as shown in FIG. 11, more generally it can have other shapes, e.g. hexagonal, octagonal, circular, or so forth. In some embodiments, the containment structure including the buried layer 112 and the encircling sidewall 116 is doped $n^+$ doped. Shallow trench isolation (STI) regions 118 may be formed adjacent the sidewall 116 to provide electrical isolation for electrodes 120 formed on the sidewall 116 where it penetrates the surface of the device 108, as shown in FIG. 10. At least one semiconductor device 122 is fabricated in and/or on the base semiconductor material 114 in the region encircled by the sidewall 116. Note, the at least one semiconductor device 122 is diagrammatically indicated in FIGS. 10 and 11 by STI regions of the at least one semiconductor device 122; however, more generally the at least one semiconductor device 122 may include components of a transistor, photodetector, MOS device, a FET such as a MOS-FET, a capacitance device, various combinations thereof, and/or so forth as further non-limiting examples.

The encircling sidewall 116 is oriented at an angle A respective to the plane of the buried layer 112, as labeled in FIG. 10. The angle A is typically (although not necessarily) close to 90°. In some embodiments, the sidewall 116 is at an obtuse angle respective to (the plane of) the buried layer 112, that is the angle A is greater than 90°. An acute angle (angle A less than 90°) is also contemplated; however, as will be explained later, formation of the sidewall 116 may be difficult if the angle A is too acute. Hence, in some embodiments the sidewall 116 is at an angle of at least 85 degrees respective to (the plane of) the buried layer 112 (where it will be appreciated that an angle of 90° or an obtuse angle >90° satisfies the constraint that the angle A is at least 85 degrees respective to (the plane of) the buried layer 112. It is also noted that the sidewall 116 may not be perfectly straight, e.g. it may have some curvature (not shown). Likewise, while the buried layer 112 is illustrated as planar, some curvature to the buried layer 112 may also be present.

The containment structure formed by the deep buried layer 112 and integrally formed encircling sidewall 116 is useful for a wide range of semiconductor devices. For example, in an LDMOS device, the base semiconductor material 114 is doped with n-type or p-type which depends on the structure. The buried layer 112 and sidewall 116 are opposite doping type compared with the semiconductor substrate 110. Thus, if the semiconductor substrate 110 is doped p-type, then the buried layer 112 and encircling sidewall 116 are both doped $n^+$-type. Conversely, if the semiconductor substrate 110 is doped n-type, then the buried layer 112 and encircling sidewall 116 are both doped $p^+$-type. Another type of device that can benefit from a containment structure is a TFT-LCD driver IC, in which the TFT-LCD may be designed to operate at lower voltages and be contained by a containment structure doped at a higher level. These are merely nonlimiting illustrative examples, and more generally various types of semiconductor devices may be fabricated with an $n^+$-type or $p^+$-type doped containment structure depending on the semiconductor device type and the doping characteristics of the substrate. Furthermore, some devices may be beneficially fabricated with a semi-insulating containment structure.

Figure 12:
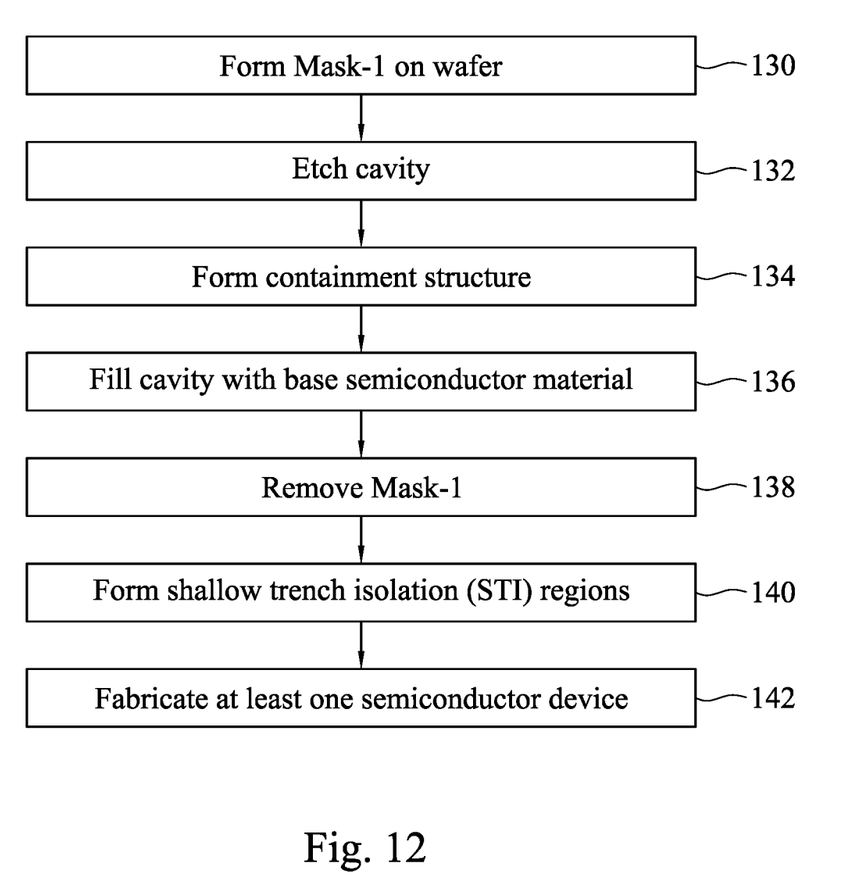
FIGS. 12-16 diagrammatically illustrate a fabrication process for fabricating a device with a buried layer according to a second process embodiment.
Figure 13:
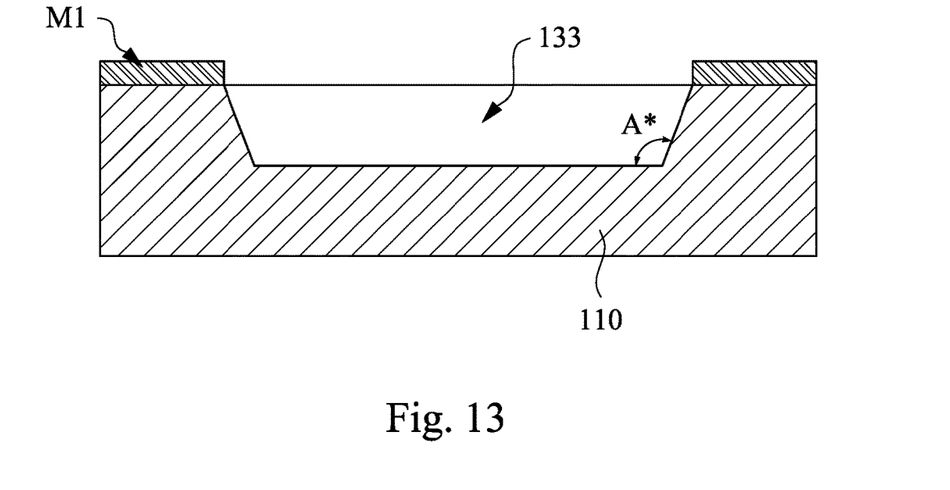

With reference to FIGS. 12-16, a suitable process for fabricating the device 108 is described. In an operation 130, the previously described first mask (i.e. "Mask-1" or "mask M1") is fabricated on the semiconductor layer or semiconductor substrate 110. FIG. 13 illustrates mask M1 on the semiconductor layer or semiconductor substrate 110. FIG. 8 shows a top view of the illustrative embodiment of Mask-1 which provides for fabricating a 3×3 array of devices 108, while again FIGS. 13-16 illustrate side sectional views of fabrication steps showing fabrication of one of those devices 108. As seen in FIG. 8, for each device the Mask M1 has openings 31, with one such opening 31 corresponding to each device (see FIG. 13). Again, it will be appreciated that the depiction in FIG. 8 of Mask-1 for a 3×3 array of devices 8 can be generalized to a mask for generating an N×M array of devices 8, and that the illustrative 3×3 array is merely an example. By way of one nonlimiting illustrative example, Mask M1 may be formed on the surface of the semiconductor layer or semiconductor substrate 110 by deposition and lithographic patterning of a resist material followed by deposition of the mask material by vacuum deposition, sputtering, or another deposition technique in accordance with the lithographic pattern, and subsequent removal of the resist.

In an operation 132 and with reference to FIG. 13, a cavity 133 is etched into the semiconductor layer or semiconductor substrate 110. The etching of the operation 132 can employ any etch technique suitable for etching the cavity 133 with the desired depth and sidewall angle. By way of nonlimiting illustrative example, in a case in which the semiconductor layer or semiconductor substrate 110 is silicon, the etching may employ reactive-ion etching (RIE) or another dry etching technique, or may employ wet etching. The mask M1 should be resistant to the chosen etching technique and chemistry so that the etching is limited to the opening(s) 31 of the mask M1 (see FIG. 8) to form the cavity 133 precisely aligned with opening(s) 31 of the mask M1. The choice of etchant and etching parameters should provide a sufficiently anisotropic etch to prevent unacceptably large undercutting underneath the mask M1. The choice of etchant and etching parameters (e.g. etch time, plasma parameters in the case of a plasma-based dry etching, chemistry of a wet etch, et cetera) can be optimized to provide the cavity 133 with a relatively flat bottom, and to design an angle A* of the sidewall of the cavity 133 respective to (the plane of) the bottom of the cavity 133. Typically, the angle A of the encircling sidewall 116 respective to (the plane of) the buried layer 112 (see FIG. 10) after fabrication is complete will be equal to, or at least close to, the angle A* of the sidewall of the cavity 133 respective to (the plane of) the bottom of the cavity 133, as the buried layer 112 and encircling sidewall 116 will be formed on or in the bottom and sidewall, respectively, of the cavity 133. Hence, in some embodiments, the sidewall of the cavity 133 is at an obtuse angle respective to (the plane of) the bottom of the cavity 133. In some broader embodiments, the sidewall of the cavity 133 is at an angle of at least 85 degrees respective to (the plane of) the bottom of the cavity 133. It is also noted that while FIG. 13 shows both the bottom and the sidewall of the cavity 133 as being planar, some curvature of the bottom and/or sidewall of the cavity 133 is contemplated, for example due to the choice of etching used in the cavity-etching operation 132 producing such non-planar bottom and/or sidewall.

Figure 14:
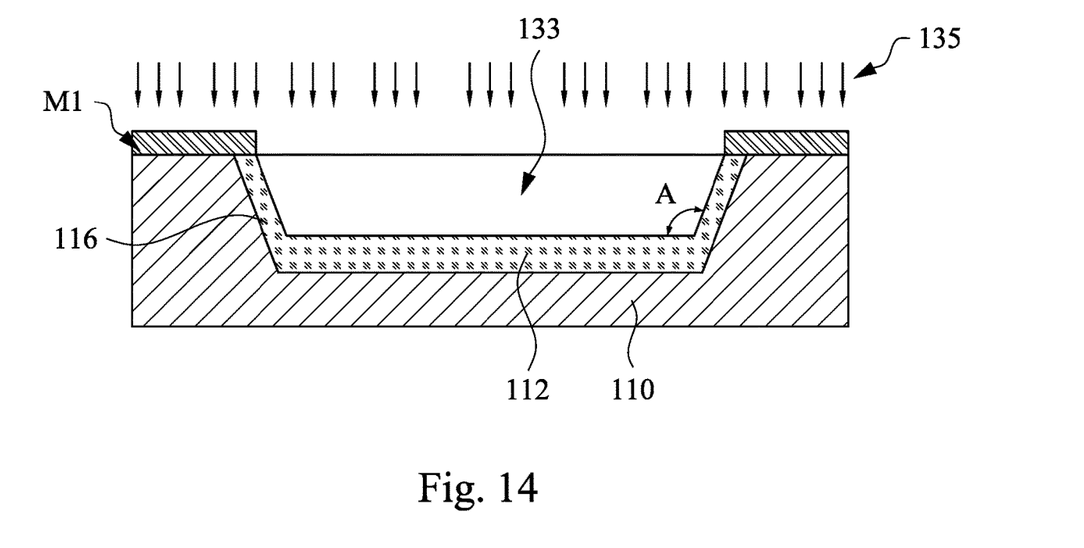

In an operation 134 and with reference to FIG. 14, the containment structure including the buried layer 112 and encircling sidewall 116 is formed. (As a note, for convenience the layer 112 is referred to as a "buried" layer throughout, even though at the fabrication stage of operation 134 the layer 112 is not yet "buried".) The containment structure lines the bottom and sidewall of the cavity 133. The operation 134 is performed with the mask M1 still in place as shown in FIG. 14, so that the formed containment structure is limited by the mask M1 to the mask-delineated area 31 (see FIG. 8). In the illustrative embodiment of FIG. 14, the operation 134 employs ion implantation (diagrammatically indicated by arrows 135 in FIG. 14). The mask M1 is resistant to the ion implantation, so that the ion implantation is limited by mask M1 to the area of the opening 31, to form the containment structure including the buried layer 112 and sidewalls 116 only in the defined area. By way of nonlimiting illustrative example, the mask M1 may comprise silicon nitride, silicon oxide, or another material of sufficient thickness and resistance to the ion implantation. For formation of the buried layer 112 and sidewalls 116 as an $n^+$ doped layer, the ion implantation suitably implants substitutional or interstitial donor atoms into the semiconductor layer or semiconductor substrate 10. Conversely, for formation of the buried layer 112 and sidewalls 116 as an $p"$ doped layer, the ion implantation suitably implants substitutional or interstitial acceptor atoms into the semiconductor layer or semiconductor substrate 10.

It will be appreciated that if the sidewall of the cavity 133 tilts significantly inward (that is, referring to FIG. 13, if the angle A* is an acute angle tilting significantly inward, e.g. an acute angle of 75° as a non-limiting example) then the sidewall of the cavity 133 may be shadowed by the overhang produced by the acute angle. This overhang can block the ion beam, so that the ion implantation is ineffective at implanting ions in the sidewall of the cavity 133. To avoid this shadowing effect, the angle A* of the sidewall of the cavity 133 respective to (the plane of) the bottom of the cavity 133 is an obtuse angle in some embodiments, and is at least 85 degrees in some embodiments. This facilitates the ion implantation of operation 134 implanting ions in the sidewall of the cavity 133 to form the n"-doped (or in other embodiments $p^+$-doped) sidewalls 116 of the containment structure.

After the ion implantation process of operation 134, the containment structure including the buried layer 112 and encircling sidewall 116 is formed into the bottom and sidewall of the cavity 133. Hence, the angle A between (the plane of) the buried layer 112 and the sidewall 116 is equal to, or at least close to, the angle A* of the of the sidewall of the cavity 133 respective to (the plane of) the bottom of the cavity 133. Some deviation between angle A* and angle A is however possible, for example if the ion implantation process produces some limited etching that changes the angle.

Figure 15:
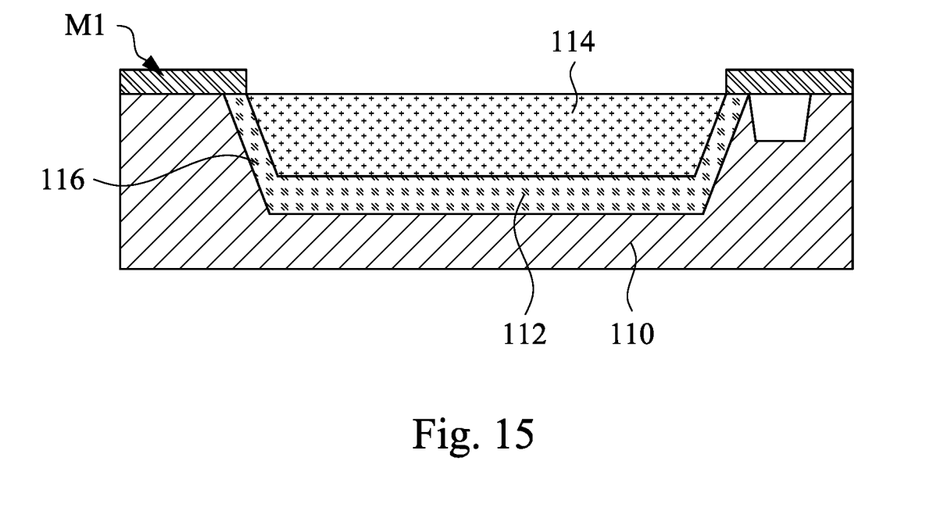

In an operation 136 and with reference to FIG. 15, the base semiconductor material 114 is deposited to fill the cavity 133, thus burying the buried layer 112 underneath the base semiconductor material 114 and the encircling sidewall 116 except at the top surface of the device 108. The deposition operation 136 is, in some nonlimiting embodiments, an epitaxial deposition, for example performed by vapor phase epitaxy (VPE), molecular beam epitaxy (MBE), or another epitaxial growth technique. As a nonlimiting example, if the semiconductor layer or semiconductor substrate 110 is a silicon layer or substrate, then the deposition operation 136 may comprise homoepitaxial deposition of silicon as the base semiconductor material 114, or may comprise heteroepitaxial deposition of the base semiconductor material 114 as a silicon alloy such as SiGe or SiC, or may comprise heteroepitaxial deposition of the base semiconductor material 114 as another semiconductor material reasonably closely lattice-matched and chemically compatible with silicon. The deposition operation 136 is performed with the mask M1 still in place, as shown in FIG. 15. After the deposition operation 136 is complete, the mask M1 is removed in an operation 138. In some embodiments, the material deposited during operation 136 does not adhere to the mask M1, thus ensuring the deposition is limited to filling the cavity 133 and does not extend to coating surfaces outside of cavity 133. Alternatively, if the deposition operation 136 also deposits material adhering to the mask M1 (where whether adherence occurs depends on the properties of the mask material and the material being deposited), then the material adhered to mask M1 is removed in a lift-off process along with the removal of mask M1 in subsequent mask removal operation 138.

After operations 136 and 138 are complete, the base semiconductor material 114 is present, contained within the containment structure including the (now) buried layer 112 and sidewalls 116.

Figure 16:
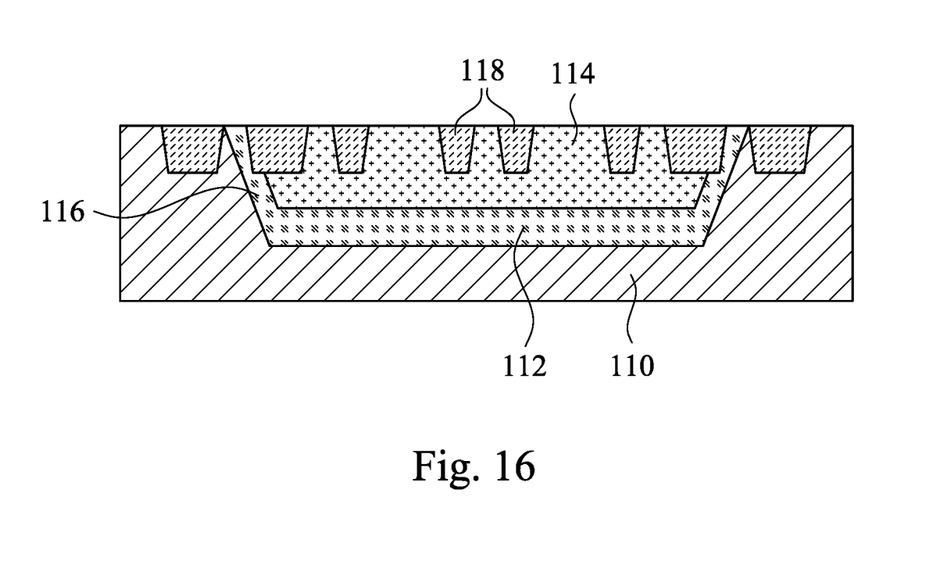

In operations 140 and 142 of FIG. 12 and with reference to FIG. 16, at least one semiconductor device is fabricated in and/or on the base semiconductor material 114. In the illustrative example, STI regions 118 are formed in regions adjacent the protrusion of the sidewall 116 at the surface of the device 108, for example to provide isolation for electrodes 120 (see FIGS. 10 and 11). STI regions 118 may also be formed in chosen regions of the base semiconductor material 114 as part of the semiconductor device fabrication.

In an operation 142, the fabrication of the at least one semiconductor device 122 is fabricated (or completed if STI regions formation is part of the semiconductor device fabrication) in and/or on the base semiconductor material 114. The fabricated at least one semiconductor device is thus encircled by the encircling sidewall 116 of the containment structure. Again note that the at least one semiconductor device 122 is diagrammatically indicated in FIG. 16 by STI regions 118, but that more generally the at least one semiconductor device 122 may include components of a transistor, photodetector, metal oxide semiconductor (MOS) device, a field effect transistor (FET) such as a MOS-FET, a capacitance device, various combinations thereof, and/or so forth as further non-limiting examples. In some embodiments, the at least one semiconductor device may not include any STI regions.

In the fabrication process of FIG. 12, the operation 134 lines the cavity 133 with the containment structure (including buried layer 112 and encircling sidewall 116) by performing ion implantation. However, the cavity 133 can be lined with the containment structure in other ways.

Figure 17:
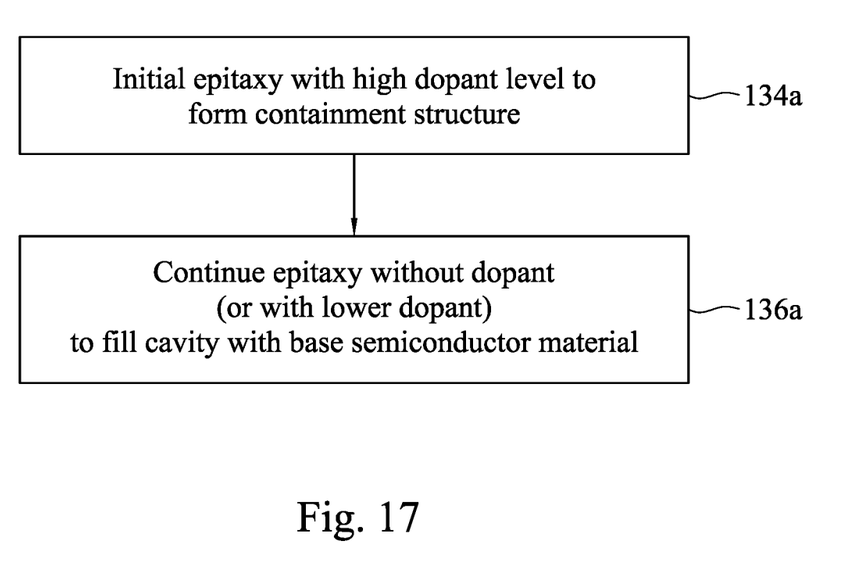
FIG. 17 diagrammatically illustrates a variant of the fabrication process shown in FIG. 12.

For example, with reference to FIG. 17, in another approach the operations 134, 136 of the fabrication flow of FIG. 12 are replaced by epitaxial deposition operations 134a and 136a shown in FIG. 17. In operation 134a, initial epitaxial deposition is performed with a high dopant level to form the buried layer 112 and encircling sidewall 116 (i.e., the containment structure) as heavily doped n⁺ (or p") doped material. The operation 134a performs epitaxial deposition at the high doping level to form the buried layer 112 to the desired thickness. Thereafter, the epitaxial deposition continues as operation 136a but now with the doping level reduced (and/or at opposite doping type) to deposit the base semiconductor material 114. In some embodiments, there may be no pause between the epitaxial deposition operations 134a and 136a, i.e. the deposition may continue seamlessly but with the flow of dopant reduced or changed entirely (in the case of a change to opposite doping type) as the epitaxy transitions from operation 134a to operation 136a. Alternatively, a growth pause (not shown) may be introduced between the epitaxial deposition 134a and the epitaxial deposition 136a in order to produce a more abrupt doping change. Conversely, if desired the change in doping level/type between operation 134a and operation 136a can be designed to be gradual (e.g. a ramp-down of doping level over a designed time interval) to provide a more gradual transition in doping level/type between the buried layer 112 and the base semiconductor material 114.

It will be noted that in both the fabrication workflow of FIG. 12 employing ion implantation to line the cavity 133 with the containment structure, and in the (partial) fabrication workflow of FIG. 17 employing epitaxial deposition to line the cavity 133 with the containment structure, the buried layer 112 and the encircling sidewall 116 comprise the same material. This contrasts with the embodiments of FIGS. 1-7, in which the buried layer 12 is formed by deposition while the deep well 16 is formed by ion implantation into a portion of the base semiconductor material 14.

The devices described with reference to FIGS. 10 and 11 and the device fabrication processes described with reference to FIGS. 12-17 mitigate or overcome some of the previously mentioned limitations of the devices described with reference to FIGS. 1 and 2 and the device fabrication processes described with reference to FIGS. 3-7. The fabrication processes of FIGS. 12-17 utilize only a single mask (mask M1), whereas the fabrication processes of FIGS. 3-7 utilize two masks (mask M1 and mask M2). Elimination of the second mask formation and removal operations 40, 44 decreases fabrication time and complexity, and potentially improves device yield.

Furthermore, there is no limitation on the thickness of the base semiconductor material 114 in the embodiments of FIGS. 10-17. By contrast, in the embodiments of FIGS. 1-7, formation of the deep well 16 entails performing the ion implantation of operation 42 to a depth corresponding to the thickness of the base semiconductor material 14, which limits its feasible thickness. Hence, for example, it is feasible to form the base semiconductor material 114 to a thickness of 200 microns or even thicker, which can be difficult or impossible in the approach of FIGS. 3-7.

Still further, the formation of the sidewall 116 by either shallow ion implantation (operation 134) or by epitaxy (operation 134a) enables the sidewall 116 to be fabricated with greater precision compared with the deeper ion implantation used to from the deep well 16 in operation 42. In embodiments corresponding to FIG. 17 in which the buried layer 112 and encircling sidewall 116 are formed by epitaxy (operation 134a), atomically abrupt interfaces at the sidewall 116 is achievable. Even in the case of using ion implantation (operation 134) to form the sidewall 116, higher precision interfaces are achievable due to the shallower implantation of operation 134 compared with the deeper ion implantation of the deep well 16 in operation 42. This, in turn, can facilitate a higher packing density of the devices 108 on a wafer.

With reference to FIGS. 18-21, some illustrative examples of the at least one semiconductor device 122 that may be fabricated in and/or on the base semiconductor material 114 in the containment structure defined by the buried layer 112 and encircling sidewall 116 are described. These are to be understood as nonlimiting illustrative examples.

Figure 18:
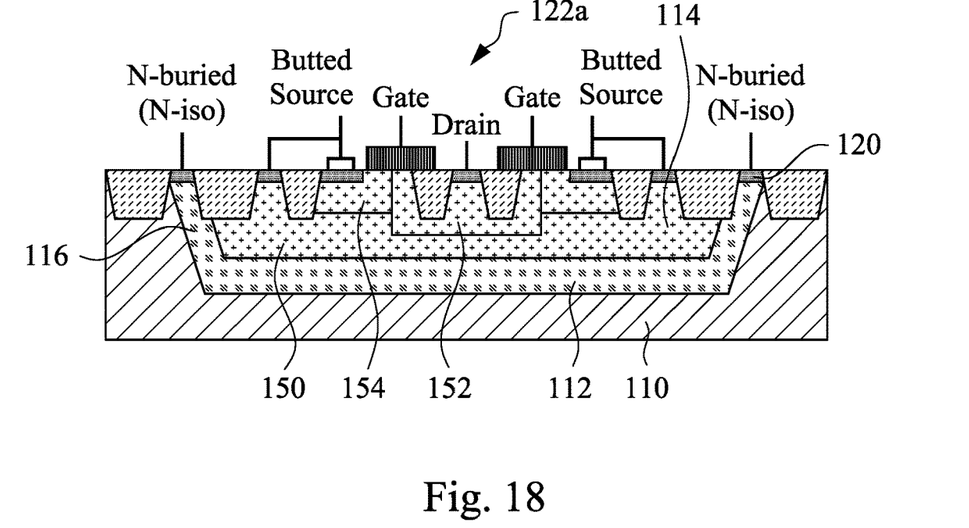
FIG. 18 illustrates a device with a buried layer according to another device embodiment.

FIG. 18 diagrammatically shows a side sectional view of an embodiment in which the at least one semiconductor device 122 comprises a laterally-diffused metal-oxide semiconductor (LDMOS) device 122a. The LDMOS device 122a is fabricated starting with the base semiconductor material 114 doped p-type to form a p-well region 150. A counter-doped n-type drain region 152 and a P-body region 154 are formed into the base semiconductor material 114 by dopant diffusion, ion implantation, a double-diffusion process, various combinations thereof, or so forth. The buried layer 112 is doped n⁺-type in this device, and the electrodes 120 contacting the buried layer 112 via the sidewall 116 forms an n-type isolation (N-iso) electrodes.

The LDMOS of FIG. 18 is a lateral device. However, the base semiconductor material 114 disposed in the containment structure 112, 116 provides a suitable bed for forming vertical devices as well, facilitating converting a normally lateral MOS-based device to a vertical MOS-based device.

Figure 19:
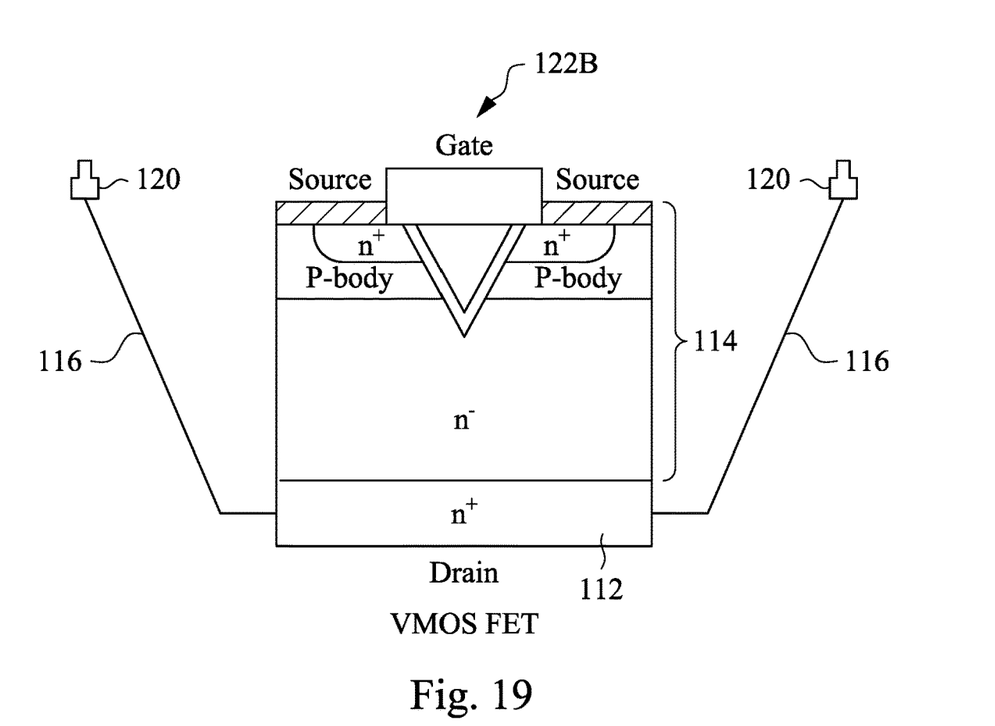
FIG. 19 illustrates a device with a buried layer according to another device embodiment.

For example, FIG. 19 diagrammatically shows a side sectional view of an embodiment in which the at least one semiconductor device 122 comprises a VMOS FET 122B (sometimes referred to as a V-groove MOS device 122B). In this device the buried layer 112 serves as the drain of the VMOS FET 122B, and the electrodes 120 formed on the sidewall 116 where it penetrates the surface of the device serves as the drain electrodes, electrically connected to the buried layer 122 via the encircling sidewall 116 as diagrammatically shown in FIG. 19.

Figure 20:
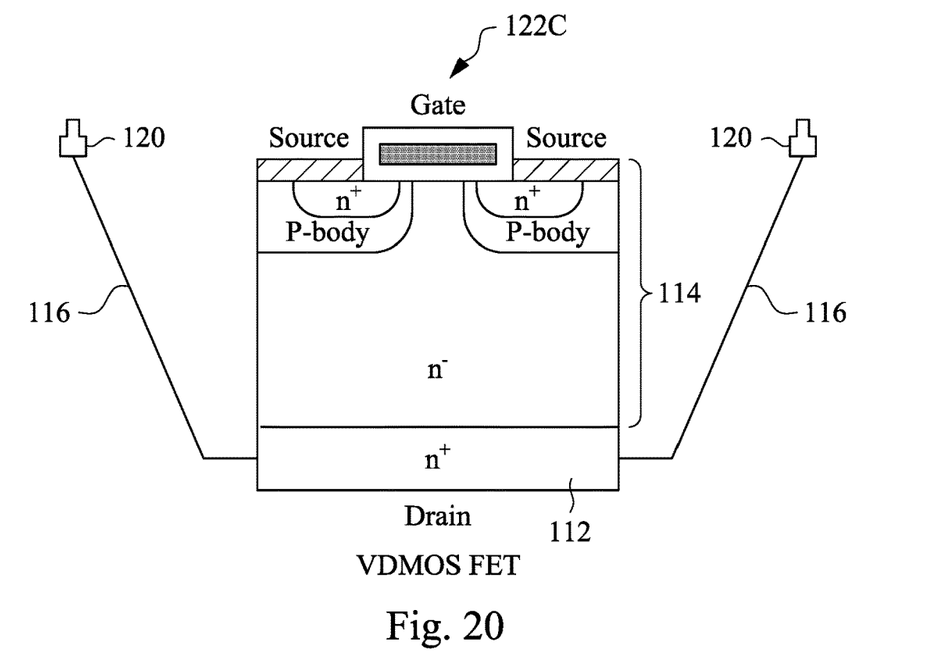
FIG. 20 illustrates a device with a buried layer according to another device embodiment.

FIG. 20 diagrammatically shows a side sectional view of an embodiment in which the at least one semiconductor device 122 comprises a VDMOS FET 122C (sometimes referred to as a vertical double diffused MOS or vertical DMOS 122C). Again, the buried layer 112 serves as the drain of the VDMOS FET 122C, and the electrodes 120 formed on the sidewall 116 where it penetrates the surface of the device serves as the drain electrodes, electrically connected to the buried layer 122 via the encircling sidewall 116 as diagrammatically shown in FIG. 20.

Figure 21:
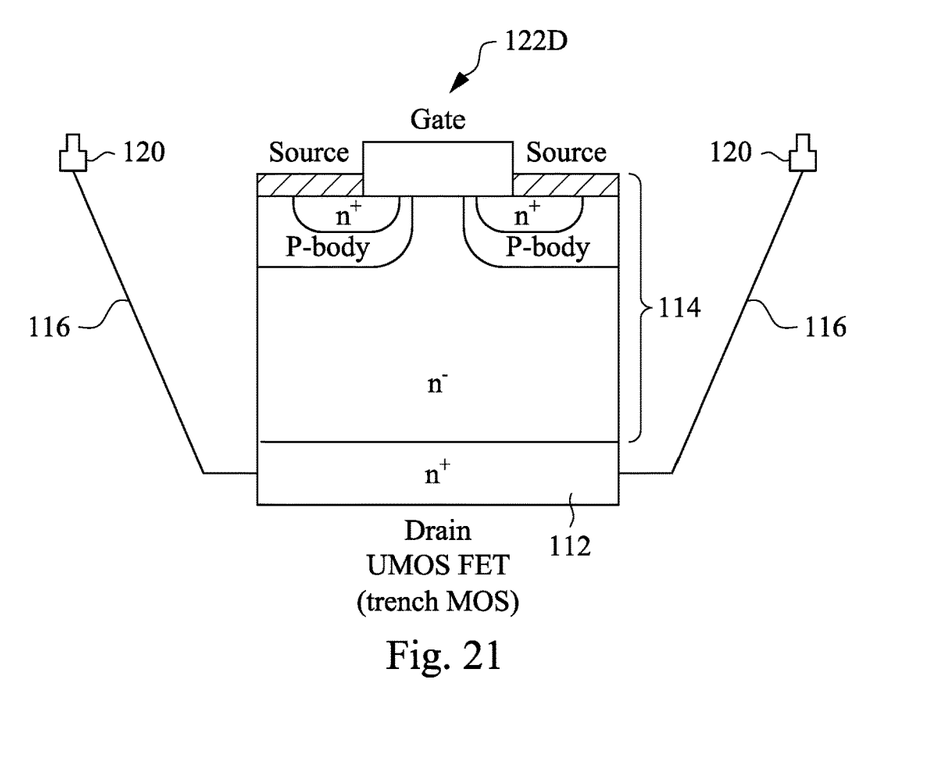
FIG. 21 illustrates a device with a buried layer according to another device embodiment.

FIG. 21 diagrammatically shows a side sectional view of an embodiment in which the at least one semiconductor device 122 comprises a UMOS FET 122C (sometimes referred to as a trench MOS 122D). Again, the buried layer 112 serves as the drain of the UMOS FET 122D, and the electrodes 120 formed on the sidewall 116 where it penetrates the surface of the device serves as the drain electrodes, electrically connected to the buried layer 122 via the encircling sidewall 116 as diagrammatically shown in FIG. 21.

These are merely illustrative embodiments, and more generally the at least one semiconductor device 122 may include a transistor, photodetector, metal oxide semiconductor (MOS) device, a field effect transistor (FET) such as a MOS-FET, a capacitance device, HVMOS, FIN-FET, memory, IGBT, RF devices, various combinations thereof, and/or so forth as further non-limiting examples.

In the following, some additional embodiments are described.

In a nonlimiting illustrative embodiment, a semiconductor manufacturing method comprises: forming a mask delineating a mask-delineated area of a semiconductor layer or semiconductor substrate; etching the semiconductor layer or semiconductor substrate to form a cavity in the semiconductor layer or semiconductor substrate wherein the etching is limited by the mask to the mask-delineated area; forming a containment structure lining the cavity wherein the forming of the containment structure is limited by the mask to the mask-delineated area; depositing a base semiconductor material in the cavity lined by the containment structure; and fabricating at least one semiconductor device in and/or on the base semiconductor material. The deposition of the base semiconductor material is limited by the mask to the mask-delineated area.

In a nonlimiting illustrative embodiment, a semiconductor device is disclosed, which is manufactured by the semiconductor manufacturing method of the immediately preceding paragraph.

In a nonlimiting illustrative embodiment, a device comprises at least one semiconductor device disposed in a base semiconductor material. A containment structure is disposed around a bottom and sides of the base semiconductor material. The containment structure includes a buried layer disposed below a bottom of the base semiconductor material and a sidewall encircling the base semiconductor material. The buried layer and the sidewall comprise a same material. A semiconductor layer or semiconductor substate is disposed around the buried layer and sidewall of the containment structure.

In a nonlimiting illustrative embodiment, a semiconductor manufacturing method is disclosed. A mask is disposed on a semiconductor layer or semiconductor substrate. The semiconductor layer or semiconductor substrate is etched in an area delineated by the mask to form a cavity. With the mask disposed on the semiconductor layer or semiconductor substrate, the cavity is lined to form a containment structure by performing ion implantation. The containment structure is filled with a base semiconductor material by epitaxial deposition of the base semiconductor material in the containment structure.

In some embodiments of the method of the immediately preceding paragraph, the filling of the containment structure with the base semiconductor material is performed with the mask disposed on the semiconductor layer or semiconductor substrate, and the mask is removed after the filling the containment structure with the base semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
  at least one semiconductor device disposed in a base semiconductor material;
  a containment structure disposed around a bottom and sides of the base semiconductor material, the containment structure including a buried layer disposed below a bottom of the base semiconductor material and a sidewall encircling the base semiconductor material wherein the buried layer and the sidewall comprise a same material; and
  a semiconductor layer or semiconductor substrate disposed around the buried layer and sidewall of the containment structure;
  wherein the at least one semiconductor device comprises a transistor and the buried layer is a source or drain of the transistor.

2. The device of claim 1 wherein the containment structure including both the buried layer and the sidewall comprises material of the semiconductor layer or semiconductor substrate modified by ion implantation.

3. The device of claim 1 wherein the containment structure including both the buried layer and the sidewall comprises a semiconductor material deposited epitaxially on the semiconductor layer or semiconductor substrate.

4. The device of claim 1 wherein the sidewall is at an obtuse angle respective to the buried layer.

5. The device of claim 1 wherein the sidewall is at an angle of at least 85 degrees respective to the buried layer.

6. The device of claim 1 wherein the base semiconductor material is doped p-type and the containment structure is doped n-type.

7. The device of claim 1 wherein the base semiconductor material is doped n-type and the containment structure is doped p-type.

8. The device of claim 1 further comprising:
  at least one electrode disposed on the sidewall of the containment structure, the at least one electrode being electrically connected by the sidewall with the buried layer disposed below the bottom of the base semiconductor material.

9. The device of claim 8 wherein:
  one of: (i) the base semiconductor material is doped n-type and the containment structure is doped n-type, or (ii) the base semiconductor material is doped p-type and the containment structure is doped p-type; and
  the at least one electrode is a source electrode or a drain electrode of the transistor.

10. The device of claim 1 wherein the transistor includes a vertical metal oxide semiconductor (VMOS) field-effect transistor.

11. The device of claim 1 wherein the transistor includes a vertical double diffused metal oxide semiconductor (VDMOS) device.

12. The device of claim 1 wherein the base semiconductor material comprises epitaxial silicon, epitaxial silicon germanium (SiGe), or epitaxial silicon carbide (SiC).

13. A device comprising:
- a vertical transistor disposed in a base semiconductor material;
- a containment structure disposed around a bottom and sides of the base semiconductor material, the containment structure including a buried layer disposed below a bottom of the base semiconductor material and a sidewall encircling the base semiconductor material; and
- a semiconductor layer or semiconductor substrate disposed around the buried layer and sidewall of the containment structure;
- wherein the buried layer is a source or drain of the vertical transistor.

14. The device of claim 13 wherein the sidewall is at an obtuse angle respective to the buried layer.

15. The device of claim 13 wherein the containment structure including both the buried layer and the sidewall comprises material of the semiconductor layer or semiconductor substrate modified by ion implantation.

16. The device of claim 13 wherein the containment structure including both the buried layer and the sidewall comprises an epitaxial layer disposed on the semiconductor layer or semiconductor substrate.

17. The device of claim 13 further comprising:
- at least one electrode disposed on the sidewall of the containment structure, the at least one electrode being electrically connected by the sidewall with the buried layer disposed below the bottom of the base semiconductor material.

18. A device comprising:
- at least one transistor disposed in a base semiconductor material having a thickness of at least 200 microns;
- a containment structure disposed around a bottom and sides of the base semiconductor material, the containment structure including a buried layer disposed below a bottom of the base semiconductor material and a sidewall encircling the base semiconductor material; and
- a semiconductor layer or semiconductor substrate disposed around the buried layer and sidewall of the containment structure.

19. The device of claim 18 wherein the buried layer and the sidewall comprise a same material.

20. The device of claim 18 wherein the buried layer is a source or drain of the transistor.

* * * * *